United States Patent
Zhong

(10) Patent No.: US 6,596,834 B2
(45) Date of Patent: *Jul. 22, 2003

(54) SILICONE RESINS AND POROUS MATERIALS PRODUCED THEREFROM

(75) Inventor: Bianxiao Zhong, Midland, MI (US)

(73) Assignee: Dow Corning Corporation, Midland, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 09/951,819

(22) Filed: Sep. 12, 2001

(65) Prior Publication Data

US 2003/0088016 A1 May 8, 2003

(51) Int. Cl.⁷ ............................................. C08G 77/12

(52) U.S. Cl. .............................. 528/31; 528/12; 528/14; 528/21; 528/23; 427/226; 427/227; 501/39

(58) Field of Search ........................... 528/31, 14, 12, 528/23, 21; 501/39; 427/227, 226

(56) References Cited

U.S. PATENT DOCUMENTS

| | | | |
|---|---|---|---|
| 4,756,977 A | | 7/1988 | Haluska et al. ............. 428/704 |
| 5,010,159 A | | 4/1991 | Bank et al. .................... 528/23 |
| 5,853,808 A | * | 12/1998 | Arkles et al. ................ 427/377 |
| 6,022,814 A | | 2/2000 | Mikoshiba et al. .......... 438/789 |
| 6,143,360 A | * | 11/2000 | Zhong ......................... 427/244 |
| 6,143,855 A | * | 11/2000 | Hacker et al. ................. 528/21 |
| 6,177,199 B1 | | 1/2001 | Hacker et al. ............... 428/447 |
| 6,184,260 B1 | * | 2/2001 | Zhong ......................... 521/154 |
| 6,197,913 B1 | | 3/2001 | Zhong ........................... 528/31 |
| 6,232,424 B1 | | 5/2001 | Zhong et al. .................. 528/12 |
| 6,313,045 B1 | | 11/2001 | Zohng et al. |
| 6,359,096 B1 | * | 3/2002 | Zhong et al. .......... 106/287.14 |
| 6,395,825 B1 | * | 5/2002 | Becker et al. .............. 524/837 |
| 6,399,210 B1 | | 6/2002 | Zohng |

\* cited by examiner

Primary Examiner—Margaret G. Moore
(74) Attorney, Agent, or Firm—Sharon K. Severance

(57) ABSTRACT

Silicone resins having the general formula $(R^1SiO_{3/2})_x(HSiO_{3/2})_y$ where $R^1$ is an alkyl group having 8 to 24 carbon atoms; x has a value of 0.05 to 0.7; y has a value of 0.3 to 0.95 and x+y =1. The resins are used to form porous ceramic materials and porous thin films on semiconductor devices.

29 Claims, No Drawings

SILICONE RESINS AND POROUS MATERIALS PRODUCED THEREFROM

FIELD OF THE INVENTION

This invention pertains to silicone resins having the general formula $(R^1SiO_{3/2})_x(HSiO_{3/2})_y$ where $R^1$ is an alkyl group having 8 to 24 carbon atoms. The resins are used to form porous thin films on semiconductor devices.

BACKGROUND OF THE INVENTION

Semiconductor devices often have one or more arrays of patterned interconnect levels that serve to electrically couple the individual circuit elements forming an integrated circuit (IC). The interconnect levels are typically separated by an insulating or dielectric coating. The coatings may be formed by chemical vapor deposition or by spin-on techniques. For example, U.S. Pat. No. 4,756,977 discloses the use of hydrogen silsesquioxane resins to form coatings on electronic devices.

As the size of the circuit elements and the spaces between such elements continues to decrease, there is a need for insulating materials that have a lower dielectric constant. In particular, materials that can provide a dielectric constant below 3 are desirable. One means for producing coatings that have a dielectric constant below 3 is to use spin-on materials that are silicon based and that when cured produce pores in the film.

Silicon containing spin-on materials have been described in U.S. Pat. Nos. 5,010,159 to Bank et al., U.S. Pat. No. 6,022,814 to Mikoshiba et al., and U.S. Pat. Nos. 6,143,855 and 6,177,199 to Hacker et al.

It has now been found that resins having the formula $(R^1SiO_{3/2})_x(HSiO_{3/2})_y$ where $R^1$ is an alkyl group having 8 to 24 carbon atoms can be used to produce coatings on electronic devices, in particular semiconductor devices. These resins can be used to produce films having a dielectric constant of 1.5 to 2.3.

SUMMARY OF THE INVENTION

This invention pertains to silicone resins having the general formula $(R^1SiO_{3/2})_x(HSiO_{3/2})_y$ where $R^1$ is an alkyl group having 8 to 24 carbon atoms. The resins can be used to form porous thin films on semiconductor devices by applying the resin onto a semiconductor device and heating the resin to a temperature sufficient to cure the resin and produce the porous coating. These coatings produced herein have a dielectric constant of 1.5 to 2.3.

DETAILED DESCRIPTION OF THE INVENTION

This invention pertains to silicone resins having the general formula $(R^1SiO_{3/2})_x(HSiO_{3/2})_y$ where $R^1$ is an alkyl group having 8 to 24 carbon atoms; x has a value of 0.05 to 0.7; y has a value of 0.3 to 0.95 and x+y=1. Preferably x has a value of 0.1 to 0.3 and y has a value of 0.7 to 0.9.

The silicone resin may be essentially fully condensed or may have some residual SiOH or $SiOR^2$ functionalities. By essentially fully condensed it is meant that the silicone resin contains <1 mole% (based on the silicone resin) of SiOH or $SiOR^2$ units, where $R^2$ is a linear alkyl group having 1 to 6 carbon atoms. Optionally, total of residual SiOH or $SiOR^2$ functionalities can be up to 15 mole%. It is preferred that the silicon resin contain <0.5 mole% of SiOH or $SiOR^2$ units for obtaining better shelf life. $R^2$ may be further exemplified by, but not limited to methyl, ethyl, propyl, butyl, pentyl, or hexyl.

The silicon resin has a weight-average molecular weight in the range of 1,500 to 400,000 and preferably in the range of 20,000 to 200,000

In the silicone resin, $R^1$ is an alkyl group having 8 to 24 carbon atoms. The alkyl group can be linear or branched. The alkyl group may be a substituted or unsubstituted alkyl group. The substituents on the substituted alkyl group may be exemplified by, but not limited to, an electron withdrawing group, a halogen, an acyl group, a trialkylsiloxy group and mixtures or multiples thereof.

Suitable electron-withdrawing groups include alkoxy groups having the formula $—OR^3$ where $R^3$ is an alkyl group having from 1 to 4 carbon atoms; hydroxyl groups (—OH); and carboxy groups having the formula $—OC(O)R^4$ where $R^4$ is an alkyl group having from 1 to 6 carbon atoms. Preferably the electron-withdrawing group is a methoxy or ethoxy group or a hydroxy group.

Preferred $R^1$ groups are branched alkyl groups having 8 to 24 carbon atoms containing an electron-withdrawing group in a pendent position on the alkyl chain; more preferred is a branched alkyl group having 8 to 24 carbon atoms containing a hydroxy or alkoxy group in a pendant position on the alkyl chain.

Specific examples of R include but are not limited to, octyl, chlorooctyl, trimethylsiloxyhexadecyl, octadecyl, docosyl, 3,7,11,15-tetramethyl-3-hydroxy-hexadecyl, 3,7,11,15-tetramethy-3-methoxy hexadecyl, 4-heptyl-4-ethoxy decyl, and 3,7-diethyl-3-hydroxy dodecyl and mixtures thereof.

Silicone resins having the formulas $(R^1SiO_{3/2})_x(HSiO_{3/2})_y$ where $R^1$, x and y are defined above are produced by combining (A) a silane having the formula $R^1SiX_3$ and (B) a silane having the formula $HSiX_3$, where each X is selected from a hydrolyzable group or a hydroxy group; in the presence of (C) solvent (D) water and (E) a hydrolysis catalyst. Preferably the silanes (A) and (B) are combined with the solvent (C) and the water (D) and hydrolysis catalyst (E) are added to the mixture.

In silanes (A) and (B), X can be a hydrolyzable group or a hydroxy group. By "hydrolyzable group" it is meant a group that is capable of hydrolyzing from the silicon atom in the presence of water (ie. X groups are replaced with —OH groups) under the reaction conditions and which groups when hydrolyzed do not adversely impact the solubility or end use of the silicone resin. Hydrolyzable groups can be exemplified by halide groups such as chloride; and alkoxy groups such as methoxy and ethoxy. Preferably X is an alkoxy group and more preferably X is an ethoxy group.

Silane (A) is typically used in an amount of 5 to 70 mole% based on the amount of (A) and (B), alternatively, 10 to 30 mole%, alternatively 14 to 20 mole%. Silane A may be exemplified by, but not limited to, 3,7,11,15-tetramethyl-3-hydroxy hexadecyl triethoxysilane; 3,7,11,15-tetramethyl-3-methoxy hexadecyl triethoxysilane; 3,7,11,15-tetramethyl-3-hydroxy hexadecyl trichlorosilane; 3,7,11,15-tetramethyl-3-methoxy hexadecyl trichlorosilane, octyltrimethoxysilane, octyltriethoxysilane, octadecyltrimthoxysilane, hexadecyltrimethoxysilane, dodecyltriethoxysilane and mixtures thereof.

Silane (B) is typically used in an amount of 30 to 95 mole% based on the amount of (A) and (B), alternatively, 70 to 90 mole%, alternatively 80 to 86 mole%. Silane (B) may be exemplified by trichlorosilane, trimethoxysilane, triethoxysilane and mixtures thereof.

Solvent (C) is any suitable organic or silicone solvent that does not contain a functional group which may participate in the reaction and is a sufficient solvent for X silanes (A) and (B). The solvent is generally used in an amount of 40 to 98 weight percent based on the total weight of solvent and silanes (A) and (B), alternatively 70 to 90 weight percent. The organic solvent may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; cyclic ethers such as tetrahydrofuran, and dioxane; ketones such as methylisobutyl ketone (MIBK) and cyclohexanone; halogen substituted alkanes such as trichloroethane; halogenated aromatics such as bromobenzene and chlorobenzene; esters such as isobutyl isobutyrate and propyl propronate. Useful silicone solvents may be exemplified by, but not limited to cyclic siloxanes such as octamethylcyclotetrasiloxane, and decamethylcyclopentasiloxane. A single solvent may be used or a mixture of solvents may be used. Preferably the solvent is a mixture of methyl isobutyl ketone and isobutyl isobutyrate.

Component (D) is water. It is preferred that the water be added in an amount sufficient to effect essentially complete hydrolysis of X in silanes (A) and (B) without a excess so great that results in a ineffective rate of reaction. Typically the water is present in an amount of 0.5 to 2 moles of water per mole of X in silanes (A) and (B), alternatively 0.8 to 1.5 moles.

Component (E) is a hydrolysis catalyst and can be any of those hydroloysis catalysts known in the art to catalyze the hydrolysis of X on silanes (A) and (B) in the presence of water. Known hydrolysis catalysts include inorganic bases such as ammonium hydroxide, potassium hydroxide and sodium hydroxide; organic bases such as trimethylamine, inorganic acids such as hydrogen chloride, sulfuric acid and nitric acid; and organic acids such as trifluoroacetic acid. Hydrolysis catalyst (E) is present in an amount sufficient to catalyze the hydrolysis of X and the optimal amount will depend upon the chemical composition of the catalyst as well as the temperature of the hydrolysis reaction. Generally, the amount of hydrolysis catalyst can be within a range of about 0.00001 to 0.5 mole per mole of silanes (A) and (B), alternatively 0.1 to 0.3 mole parts.

In the process for making the silicone resin it is preferred to combine silanes (A) and (B) with solvent (C). Water (D) and hydrolysis catalyst (E) are thereafter added, either separately or as a mixture, to the first mixture. The reaction can be carried out at any temperature so long as it does not cause significant gellation or cause curing of the silicone resin. Typically the reaction is carried out at a temperature in the range of 15° C. to 100° C., with ambient temperature suggested.

The time to form the silicone resin is dependent upon a number of factors such as the temperature, the specific amounts of silanes (A) and (B), and the amount of catalyst. Typically the reaction time is from several minutes to several hours. One skilled in the art will be able to readily determine the time necessary to complete the reaction.

Following completion of the reaction the catalyst may be optionally removed.

Methods for removing the catalyst are well know in the art and would include neutralization, stripping or water washing or combinations thereof. The catalyst may negatively impact the shelf life of the silicone resin, especially when in solution thus its removal is suggested.

In the process for making the silicone resin, after the reaction is complete, volatiles may be removed from the silicone resin solution under reduced pressure. Such volatiles include alcohol by-products, excess water, catalyst and solvents. Methods for removing volatiles are known in the art and include, for example, distillation.

To increase the molecular weight of the silicone resin and/or to improve the storage stability of the silicone resin the reaction may be carried out for an extended period of time with heating from 40° C. up to the reflux temperature of the solvent ("bodying step"). The bodying step may be carried out subsequent to the reaction step or as part of the reaction step. Preferably, the bodying step is carried out for a period of time in the range of 30 minutes to 6 hours, more preferably 1 to 3 hours.

Following the reaction to produce the silicone resin and the optional bodying step a number of optional steps may be carried out to obtain the silicone resin in the desired form. For example, the silicone resin may be recovered in solid form by removing the solvent. The method of solvent removal is not critical and numerous methods are well known in the art (e.g. distillation under heat and/or vacuum). Once the silicone resin is recovered in a solid form, the resin can be optionally re-dissolved in the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

The silicone resins produced herein are particularly useful in forming porous ceramic materials, ceramic membranes or porous coatings on a substrate, in particular an electronic substrate. By electronic substrate it is meant to include silicon-based devices and gallium arsenide-based devices intended for use in the manufacture of a semiconductor component. In particular, the silicone resins are useful in forming porous coatings in integrated circuits. The silicone resins can be used to produce thin coatings having a dielectric constant in the range of 1.5 to 2.2 thereby making the silicone resins particularly useful in the formation of inter layer dielectric films.

The silicon resin may be used to prepare a porous coating on a substrate by (I) coating the substrate with a silicone resin having the formula $(R^1SiO_{3/2})_x(HSiO_{3/2})_y$ where $R^1$ is an alkyl group having 8 to 24 carbon atoms; x has a value of 0.05 to 0.7; y has a value of 0.3 to 0.95 and x+y=1;

(II) heating the coated substrate at a temperature sufficient to cure the silicone resin and produce a cured resin coating, and (III) further heating the cured resin coating at a temperature sufficient to remove $R^1$ groups from the cured resin coating thereby forming a porous coating on the substrate.

The silicone resin is typically applied to the substrate as a solvent dispersion. Solvents that may be used include any agent or mixture of agents that will dissolve or disperse the silicon resin to form an essentially homogeneous liquid mixture. The solvent is typically a solvent or mixture of solvents that are used in the reaction to produce the silicone resin, described above. Preferred solvents include cyclohexanone, isobutyl isobutyrate and mesitylene.

The amount of solvent is not particularly limited but is typically present in an amount of 40 to 98% by weight, preferably 70 to 90% based on the weight of silicone resin and solvent.

Specific methods for application of the silicone resin to the substrate include, but are not limited to, spin-coating, dip-coating, spay-coating, flow-coating, screen-printing and others. The preferred method for application is spin-coating.

When a solvent is used the solvent is removed from the coated substrate following application. Any suitable means for removal may be used such as drying, the application of a vacuum and/or the application of heat (i.e. such as passing a coated wafer over hot plates). When spin coating is used, the additional drying method is minimized since the spinning drives off most of the solvent.

Following application to the substrate, the coated substrate is heated at a temperature to cure the silicone resin ("curing step"). A cured silicone resin is essentially insoluble in a solvent which may be used for it application to the substrate. Typically the coated substrate is heated to a temperature in the range of 20° C. to 350° C. to cure the silicone resin.

The cured silicone resin on the substrate is then further heated to a temperature sufficient to remove the $R^1$ groups from the cured resin coating thereby forming a porous coating on the substrate ("removal step"). Typically the cured resin is heated to a temperature in the range of 350° C. up to the temperature at which the backbone of resin decomposes. Typically the cured silicone resin is heated to a temperature in the range of 350° C. to 600° C., alternatively 400° C. to 550° C., alternatively 425° C. to 475° C. Essentially all of the $R^1$ groups are cleaved during this step. However, residual small alkyl groups such as methyl or ethyl resulted from $R^1$ groups may remain in the coating The weight percentage of $R^1$ groups removed will affect the dielectric constant of the film as well as the porosity. It is suggested to heat for a period of time sufficient to remove most of the $R^1$ groups, such as 90% by weight from the cured resin. The amount of $R^1$ that is removed can be determined by FTIR, for example The curing step and removal step may be carried out separately or in a single step wherein the curing takes place as the coated substrate is being heated to the temperature for removal.

It is preferred that the curing step and removal step be carried in an inert environment. Inert atmospheres useful herein include, but are not limited to nitrogen, and argon. By "inert" it is meant that the environment contain less than 50 ppm and preferably less than 10 ppm of oxygen. The pressure at which the curing and removal steps are carried out is not critical. The curing and removal steps are typically carried out at atmospheric pressure however, sub or super atmospheric pressures may work also.

Any method of heating may be used during the curing and removal steps. For example, the substrate may be placed in a quartz tube furnace, convection oven or allowed to stand on hot plates.

By this method it is possible to produce porous coatings on a substrate. Preferably the porous coatings have a thickness of 0.3 to 2.5 pm, more preferably 0.5 to 1.2 $\mu$m. The porous coatings have a dielectric constant in the range of 1.5 to 2.3. The amount of porosity in the films is dependent upon the amount of $R^1$ groups in the starting resin and the degree to which they are removed. Typically the porous coatings will have a porosity of 20 to 60%.

Porous ceramics or ceramic membranes may be produced by heating the silicone resin at a temperature sufficient to cure the silicone resin and further heating the cured silicone rein at a temperature sufficient to remove $R^1$ groups from the cured resin coating thereby forming a porous ceramic or porous ceramic membrane. The process conditions are similar to those described herein above for producing the porous coating on a substrate absent coating the substrate with the silicone resin. However, in the step of removing $R^1$ groups, the temperature can be much higher such as 800 deg. C., and oxidative atmosphere can be used to minimize residual alkyl group.

The following non-limiting examples re provided so that one skilled in the art may more readily understand the invention.

EXAMPLES

EXAMPLE 1

Samples 1-1 through 1-4 were prepared by combining in the amounts described in Table 1:

(A) triethoxysilane, (B) an organotrialkoxysilane, $R^1Si(OR^2)_3$, and (C) mixture of methyl isobutyl ketone (MIBK) and isobutyl isobutyrate (6:4 weight ratio), enough to make the concentration of the resulting resin 9%.

To this mixture was added a mixture of (D) water and (E) hydrogen chloride in the amounts described in Table 1. The resulting reaction product was stripped of volatiles under reduced pressure at 60° C. until the solid content became 22–20%. Isobutyl isobutyrate was added to make the solid content 20%. The solution was then 5 heated to reflux for 1 hour and water produced was removed continuously. The resulting resin solutions were spin-coated onto silicon wafers suitable for dielectric constant measurements, and cured in a nitrogen flow at 470° C. for 1 hr. The dielectric constants were measured and shown in Table 1.

TABLE 1

| Sample | | | Wt. Parts | | | | | Molar ratio A:B | | Dielectric |
|---|---|---|---|---|---|---|---|---|---|---|
| No. | $R^1$ | $R^2$ | (A) | (B) | (C) | (D) | (E) | (A) | (B) | constant |
| 1-1 | 3,7,11,15-tetramethyl-3-hydroxy-hexadecyl | Et | 1 | 0.89 | 8.65 | 0.48 | 0.04 | 76 | 24 | 1.77 |
| 1-2 | 3,7,11,15-tetramethyl-3-methoxy-hexadecyl | Me | 1 | 0.83 | 8.99 | 0.48 | 0.04 | 76 | 24 | 1.85 |
| 1-3 | dodecyl | Et | 1 | 0.64 | 6.16 | 0.48 | 0.04 | 76 | 24 | 2.0 |
| 1-4 | octadecyl | Me | 1 | 0.72 | 7.88 | 0.48 | 0.04 | 76 | 24 | 1.97 |

Comparative Example 2

Comparative samples C2–1 through C2–3 were prepared by combining in the amounts described in Table 2:

(A) triethoxysilane, (B) an organotrialkoxysilane, $R^5Si(OR^2)_3$, and (C) mixture of methyl isobutyl ketone (MIBK) and isobutyl isobutyrate (6:4 weight ratio), enough to make the concentration of the resulting resin 9%.

To this mixture was added a mixture of (D) water and (E) hydrogen chloride in the amounts described in Table 2. The resulting reaction product was stripped of volatiles under reduced pressure at 60° C. until the solid content became 22–20%. Isobutyl isobutyrate was added to make the solid content 20%. The resulting resin solutions were spin-coated onto silicon wafers suitable for dielectric constant measurements, and cured in a nitrogen flow at 470° C. for 1 hr. The dielectric constants were measured and are shown in Table 2.

TABLE 2

| Sample No. | $R^5$ | $R^2$ | Wt. Parts (A) | (B) | (C) | (D) | (E) | Molar ratio A:B (A) | (B) | Dielectric constant |
|---|---|---|---|---|---|---|---|---|---|---|
| C2-1 | Iso-butyl | Et | 1 | 0.42 | 3.98 | 0.48 | 0.04 | 76 | 24 | 3.05 |
| C2-2 | Iso-butyl | Et | 1 | 2.01 | 10.67 | 0.90 | 0.08 | 40 | 60 | 2.82 |
| C2-3 | trifluoropropyl | Me | 1 | 1.99 | 14.75 | 0.90 | 0.08 | 40 | 60 | 3.03 |

TABLE 3

| Sample | 395° C. | 410° C. | 425° C. | 440° C. | 455° C. | 470° C. |
|---|---|---|---|---|---|---|
| 1-1 | cracked | 1.97 | 1.75 | 1.78 | 1.73 | 1.77 |
| 1-2 | 2.61 | cracked | 1.96 | 1.88 | 1.85 | 1.85 |
| 1-3 | 2.52 | 2.51 | cracked | cracked | cracked | 2.0 |
| 1-4 | 2.43 | 2.42 | cracked | cracked | cracked | 1.97 |

EXAMPLE 3

Samples from Example 1 were spin-coated onto silicon wafers. Half of the wafers were suitable for dielectric constant measurements and the other half was suitable for FTIR measurements. The spin rates were selected in the range of 1200 to 1800 RPM to achieve as-spun thickness in the range of 7500–9100 angstroms. The coated wafers were heated in a quartz tube furnace in a nitrogen atmosphere at different temperatures for one hour. After 24 hours, all cured films were inspected for cracking, and dielectric constants, refractive indexes and FTIR spectra were measured for crack-free films. Table 3 shows the cracked films and dielectric constants of crack-free films. Table 4 shows refractive indexes for all crack-free films and as-spun films. Table 5 shows the percentages of $R^1$ group lost after the films were cured for one hour. The values were calculated from the FTIR C-H peak intensities per unit of thickness before and after curing.

The data in Table 3 demonstrates that an organohydridosiloxane resin with a branched organic group such as 3,7,11,15-tetramethyl-3-hydroxy-hexadecyl or 3,7,11,15-tetramethyl-3-methoxy-hexadecyl forms crack-free films with ultra-low dielectric constants (equal to or smaller than 2.0) at a lower cure temperature than those with a linear organic group such as octadecyl or dodecyl.

As shown in Table 4 all crack-free films cured at lower temperatures (395° C. for sample 1–2, 395 and 410° C. for 1–3 and 1–4) had virtually identical refractive indexes to the as-spun films, indicating these cured films had no porosity; all crack-free films cured at higher temperatures had significantly lower refractive indexes than the as-spun films, indicating significant porosity in these cured films. The data in Table 4 indicated that an organohydridosiloxane resin with a branched organic group such as 3,7,11,15-tetramethyl-3-hydroxy-hexadecyl or 3,7,11,15-tetramethyl-3-methoxy-hexadecyl forms crack-free porous thin films at a lower cure temperature than those with a linear organic group such as octadecyl or dodecyl.

As shown in Table 5, an organohydridosiloxane resin with a branched organic group such as 3,7,11,15-tetramethyl-3-hydroxy-hexadecyl started to lose majority of its $R^1$ group at a relatively low temperature (410° C.) compared to those a linear organic group such as octadecyl or dodecyl.

TABLE 4

| Sample | Aspun | 395° C. | 410° C. | 425° C. | 440° C. | 455° C. | 470° C. |
|---|---|---|---|---|---|---|---|
| 1-1 | 1.45 | cracked | 1.25 | 1.20 | 1.20 | 1.20 | 1.20 |
| 1-2 | 1.45 | 1.45 | cracked | 1.30 | 1.27 | 1.26 | 1.26 |
| 1-3 | 1.45 | 1.44 | 1.44 | cracked | cracked | cracked | 1.28 |
| 1-4 | 1.45 | 1.45 | 1.45 | cracked | cracked | cracked | 1.28 |

TABLE 5

| Sample | 395° C. | 410° C. | 425° C. | 440° C. | 455° C. | 470° C. |
|---|---|---|---|---|---|---|
| 1-1 | cracked | 76% | 85% | 89% | 92% | 93% |
| 1-2 | 8% | cracked | 65% | 84% | 87% | 89% |
| 1-3 | 8% | 8% | cracked | cracked | cracked | 88% |
| 1-4 | 8% | 8% | cracked | cracked | cracked | 87% |

EXAMPLE 4

An organohydridosiloxane resin with 3,7,11,15-tetramethyl-3-hydroxy-hexadecyl group was formed by the method of described in Example 1 for sample 1-1, except that the ratio of A/B was 84 to 16. A sample of this resin solution was heated to make porous and porosity and pore size was determined. Another sample was coated on a silicon wafer and physical characteristics of the coating on the substrate determined.

A sample of the resin solution was placed in a crucible and heated at 150° C. first to remove solvent, and then at 425° C. in nitrogen for one hour. The resulting solid was tested for nitrogen adsorption at 77° K. using a Micrometrics ASAP 2000 Accelerated Surface Area and Porosimetry System (Micrometrics Instrument Corporation, Norcross, Ga.). The BET surface area was determined to be 875 $m^2$/g. H-K analysis (Horvath, *J. Chem. Eng. Jpn.*, 1983, Vol. 16, p. 476) of the adsorption data indicated that the solid had a micropore volume of 0.402 cc/g, a narrow pore size distribution, and a median pore size of 0.94 nm.

Another sample of the resin solution was used to spin coat a silicon wafer. The coated silicon wafer was heated in a nitrogen atmosphere at 425° C. for 1 hour. The resulting film had a thickness of 0.44 microns with a thickness variation of 0.7%, a refractive index of 1.225, and a dielectric constant of 1.95.

Example 4 demonstrates that an organohydridosiloxane resin having an $R^1$ is a hydrocarbon group comprising about 8 to 24 carbon atoms or a substituted hydrocarbon group comprising a hydrocarbon chain having about 8 to 24 carbon atoms forms nanoporous solids with a median pore size smaller than 1 nanometer upon heating.

EXAMPLE 5

Samples 5–1 through 5–7 were prepared by combining in the amounts described in Table 1 (weight parts per weight part of A):

(A) triethoxysilane, (B) 3,7,11,15-tetramethyl-3-hydroxy-hexadecyl triethoxysilane, and (C) mixture of methyl isobutyl ketone (MIBK) and isobutyl isobutyrate (6:4 weight ratio), enough to make the concentration of the resulting resin 9%.

To this mixture was added a mixture of (D) water and (E) hydrogen chloride in the amounts described in Table 1 (weight parts per weight part of A). The resulting reaction product was stripped of volatiles under reduced pressure at 60° C. until the solid content became 22–20%. Isobutyl isobutyrate was added to make the solid content 20%. The solution was then heated to reflux for 1 hour and water produced was removed continuously with a Dean Stark trap.

A sample of each resin solution was filtered through a 1.0 micron glass fiber syringe filter and a 0.2 micron Teflon syringe filter, spin-coated onto a silicon wafer, and cured at 425° C. for one hour in nitrogen. The spin rate was selected so that the thickness of the cured films was in the range of 600–800 nm. Dielectric constants and modulus of the films were measured and the values are shown in Table 6. Modulus was measured by nanoindentation with a percentage of penetration depth of 10%. The data in Example 5 indicates that dielectric constants and modulus of the thin film made from 3,7,11,15-tetramethyl-3-hydroxy-hexadecyl hydridosiloxane resins can be varied in the ranges of 1.7–2.1 and 2.6–7.0 respectively by varying a molar percentage of 3,7,11,15-tetramethyl-3-hydroxy-hexadecyl group in the range of 24–10%.

TABLE 6

| Sample No. | Wt. part (B) | Wt. Part (C) | Wt. Part (D) | Wt. Part (E) | Molar percent of B | Dielectric constant | Film modulus GPa |
|---|---|---|---|---|---|---|---|
| 5-1 | 0.31 | 4.47 | 0.04 | 0.40 | 10 | 2.12 | 7.0 |
| 5-2 | 0.38 | 4.98 | 0.04 | 0.41 | 12 | 2.07 | 6.8 |
| 5-3 | 0.46 | 5.52 | 0.04 | 0.42 | 14 | 2.04 | 5.9 |
| 5-4 | 0.53 | 6.09 | 0.04 | 0.43 | 16 | 1.95 | 4.7 |
| 5-5 | 0.62 | 6.68 | 0.04 | 0.44 | 18 | 1.90 | 3.4 |
| 5-6 | 0.70 | 7.31 | 0.04 | 0.45 | 20 | 1.85 | 3.1 |
| 5-7 | 0.89 | 8.65 | 0.04 | 0.48 | 24 | 1.73 | 2.6 |

EXAMPLE 6

Samples 6–1 and 6–2 were prepared identically to sample 5–4, and sample 6–3 and 6–4 were prepared identically to sample 5–7. To sample 6–1 and 6–3, a NaOH/ethanol solution with a NaOH concentration of 2% was added to make the amount of Na in the solution 1 ppm. A sample of each resin solution was filtered through 0.2 micron Teflon syringe filter, spin-coated onto a silicon wafer, and cured at 425° C. for one hour in nitrogen. The spin rate was selected so that the thickness of the cured films was in the range of 600–800 nm. Dielectric constants and modulus of the films were measured and the values are shown in Table 7. Modulus was measured by nanoindentation with a percentage of penetration depth of 10%. The data in Example 5 indicates that modulus of the thin film made from 3,7,11,15-tetramethyl-3-hydroxy-hexadecyl hydridosiloxane resins can be increased by adding a base catalyst. It was found that filtration of the resin solution through the 1.0 urn glass fiber filter also brought NaOH into the resin solution, which also increased the film modulus (see Example 5).

TABLE 7

| Sample No. | Wt. part (B) | Wt. Part (C) | Wt. Part (D) | Wt. Part (E) | Molar percent of B | Add NaOH | Dielectric constant | Film modulus GPa |
|---|---|---|---|---|---|---|---|---|
| 6-1 | 0.53 | 6.09 | 0.04 | 0.43 | 16 | Yes | 1.93 | 4.8 |
| 6-2 | 0.53 | 6.09 | 0.04 | 0.43 | 16 | No | 1.96 | 2.0 |
| 6-3 | 0.89 | 8.65 | 0.04 | 0.48 | 24 | Yes | 1.75 | 2.5 |
| 6-4 | 0.89 | 8.65 | 0.04 | 0.48 | 24 | No | 1.73 | 1.5 |

What is claimed is:

1. A silicone resin having the formula $(R^1SiO_{3/2})_x(HSiO_{3/2})_y$ where $R^1$ is a branched alkyl group having 8 to 24 carbon atoms containing an electron-withdrawing group in a pendant position on the alkyl chain; x has a value of 0.05 to 0.7; y has a value of 0.3 to 0.95 and x+y=1.

2. The silicone resin as claimed in claim 1 wherein $R^1$ is chosen from, 3,7,11,15-tetramethyl-3-hydroxy-hexadecyl, 3,7,11,15-tetramethy-3-methoxy-hexadecyl, 4-heptyl4-ethoxy decyl, and 3, 7-diethyl-3-hydroxy-dodecyl and mixtures thereof.

3. The silicone resin as claimed in claim 1 wherein $R^1$ is 3,7,11,15-tetramethyl-3-hydroxy-hexadecyl.

4. The silicone resin as claimed in claim 1 wherein $R^1$ is 3,7,11,15-tetramethy-3-methoxy-hexadecyl.

5. The silicone resin as claimed in claim 1 wherein x has a value of 0.1 to 0.3; y has a value of 0.7to 0.9 and x+y=1.

6. The silicone resin as claimed in claim 1 wherein the silicone resin contains $\leq 1$ mole % of SiOH and $SiOR^2$ functionality wherein $R^2$ is a linear alkyl group having 1 to 6 carbon atoms.

7. A method for producing a silicone resin comprising (I) combining (A) a silane having the formula $R^1SiX_3$ and (B) a silane having the formula $HSiX_3$ in the presence of (C) solvent (D) water and (E) a hydrolysis catalyst;

wherein $R^1$ is a branched alkyl group having 8 to 24 carbon atoms containing an electron-withdrawing group in a pendant position on the alky chain and each X is selected from a hydrolyzable group or a hydroxy group (II) reacting the combination (1) at a temperature and for a time sufficient to form a silicone resin having a formula $(R^1SiO_{3/2})_x(HSiO_{3/2})_y$ where $R^1$ is a branched alkyl group having 8 to 24 carbon atoms containing an electron-withdrawing group in a pendant position on the alkyl chain; x has a value of 0.05 to 0.7; y has a value of 0.3 to 0.95 and x+y=1.

8. The method as claimed in claim 7 wherein $R^1$ is chosen from, 3,7,11,15-tetrmethyl-3-hydroxy-hexadecyl, 3,7,11,15-tetrarnethy-3-methoxy-hexadecyl, 4-heptyl4-ethoxy decyl, and 3, 7-diethyl-3-hydroxy-dodecyl and mixtures thereof.

9. The method as claimed in claim 7 wherein X is an alkoxy group.

10. The method as claimed in claim 7 wherein A is used in an amount in the range of 14 to 20 mole% based on the amount of (A) and (B).

11. The method as claimed in claim 7 wherein A is chosen from 3,7,11,15-tetramethyl-3-hydroxy-hexadecyl triethoxysilane; 3,7,11,15-tetrarnethyl-3-methoxy-hexadecyl triethoxysilane; 3,7,11,15-tetramethyl-3-hydroxy-hexadecyl trichlorosilane; 3,7,11,15-tetramethyl-3-methoxy-hexadecyl trichlorosilane, and mixtures thereof.

12. The method as claimed in claim 7 wherein (B) is used in an amount in the range of 80 to 86 mole% based on the amount of (A) and (B).

13. The method as claimed in claim 7 wherein (B) is chosen from trichlorosilane, trimethoxysilane, triethoxysilane and mixtures thereof.

14. The method as claimed in claim 7 wherein (C) is used in an amount in the range of 70 to 90 weight percent based on the total weight of (A) and (B).

15. The method as claimed in claim 7 wherein (C) is chosen from at least one saturated aliphatic solvent, cycloaliphatic solvent, aromatic solvent, cyclic ether solvent, ketone solvent, halogen substituted alkane solvent, halogenated aromatic solvent, ester solvent, silicone solvent and mixtures thereof.

16. The method as claimed in claim 7 wherein (D) is used in an amount in the range of 0.8 to 1.5 moles of (C) per mole of X in (A) and (B).

17. The method as claimed in claim 7 wherein (E) is used in an amount in the range of 0.1 to 0.3 moles per mole of (A) and (B).

18. The method as claimed in claim 7 wherein (E) is chosen from potassium hydroxide, sodium hydroxide, hydrogen chloride, sulfuric acid, and nitric acid.

19. The method as claimed in claim 7 wherein combination (I) is reacted at a temperature in the range of 15° C. to 100° C.

20. The method as claimed in claim 7 wherein any volatiles are removed after the silicone resin has been formed.

21. The method as claimed in claim 7 wherein the silicone resin is bodied by heating at temperature in the range of 40° C. up to the temperature at which the solvent will reflux for a period of time in the range of 30 minutes to 6 hours.

22. A method for producing a porous ceramic comprising
(I) heating a silicone resin having a formula $(R^1SiO_{3/2})_x(HSiO_{3/2})_y$ where $R^1$ is a branched alkyl group having 8 to 24 carbon atoms containing an electron-withdrawing group in a pendant position on the alkyl chain; x has a value of 0.05 to 0.7; y has a value of 0.3 to 0.95 and x+y=1 at a temperature sufficient to cure the silicone resin;
(II) further heating the cured resin at a temperature sufficient to remove R groups from the cured resin thereby forming a porous ceramic.

23. A method for producing a porous coating on a substrate comprising:
(I) coating the substrate with a silicone resin having a formula $(R^1SiO_{3/2})_x(HSiO_{3/2})_y$ where $R^1$ is a branched alkyl group having 8 to 24 carbon atoms containing an electron-withdrawing group in a pendant position on the alkyl chain; x has a value of 0.05 to 0.7; y has a value of 0.3 to 0.95 and x+y=1;
(II) heating the coated substrate in an inert atmosphere at a temperature sufficient to cure the silicone resin;
(III) further heating the cured resin coating in an inert atmosphere at a temperature sufficient to remove $R^1$ groups from the cured resin coating thereby forming a porous coating on the substrate.

24. The method as claimed in claim 23 wherein the silicone resin is dispersed in a solvent.

25. The method as claimed in claim 24 wherein the solvent is chosen from at least one saturated aliphatic solvent, cycloaliphatic solvent, aromatic solvent, cyclic ether solvent, ketone solvent, halogen substituted alkane solvent, halogenated aromatic solvent, ester solvent, silicone solvent and mixtures thereof.

26. The method as claimed in claim 23 wherein the $R^1$ is chosen from, 3,7,11,15-tetramethyl-3-hydroxy-hexadecyl, 3,7,11,15-tetramethy-3-methoxy-hexadecyl, 4-heptyl4thoxydecyl, and 3, 7-diethyl-3-hydroxy-dodecyl and mixtures thereof.

27. The method as claimed in claim 23 wherein the substrate is coated with the silicone resin by spin coating.

28. The method as claimed in claim 23 wherein the coated substrate is heated at a temperature in the range of 20° C. to 350° C.

29. The method as claimed in claim 23 wherein the cured resin coating is heated at a temperature in the range of 350° C. to 600° C.

* * * * *